(12) United States Patent
Manning (10) Patent No.: US 8,966,165 B2
(45) Date of Patent: *Feb. 24, 2015

(54) TRANSLATION LAYER IN A SOLID STATE STORAGE DEVICE

(71) Applicant: Micron Technology, Inc., Boise, ID (US)

(72) Inventor: Troy Manning, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 14/467,322

(22) Filed: Aug. 25, 2014

(65) Prior Publication Data

US 2014/0365720 A1  Dec. 11, 2014

Related U.S. Application Data

(63) Continuation of application No. 12/250,043, filed on Oct. 13, 2008, now Pat. No. 8,838,876.

(51) Int. Cl.
| | |
|---|---|
| G06F 12/00 | (2006.01) |
| G11C 16/00 | (2006.01) |
| G06F 12/02 | (2006.01) |
| G11C 16/10 | (2006.01) |

(52) U.S. Cl.
CPC .... G06F 12/0246 (2013.01); *G06F 2212/7208* (2013.01); *G11C 16/102* (2013.01)
USPC .......................................... 711/103

(58) Field of Classification Search
CPC .......................... G06F 12/0246; G11C 16/102
See application file for complete search history.

(56) References Cited

U.S. PATENT DOCUMENTS

| | | | |
|---|---|---|---|
| 4,737,909 A | 4/1988 | Harada | |
| 5,375,214 A | 12/1994 | Mirza et al. | |
| 5,937,425 A | 8/1999 | Ban | |
| 6,260,102 B1 * | 7/2001 | Robinson | 711/103 |
| 6,425,051 B1 * | 7/2002 | Burton et al. | 711/113 |
| 7,191,296 B2 | 3/2007 | Yoshii et al. | |
| 7,472,231 B1 | 12/2008 | Cihla et al. | |
| 7,945,752 B1 | 5/2011 | Miller et al. | |
| 2002/0120824 A1 | 8/2002 | Hooper, III | |
| 2008/0195802 A1 | 8/2008 | Lee et al. | |
| 2008/0209116 A1 | 8/2008 | Caulkins | |
| 2008/0228995 A1 | 9/2008 | Tan et al. | |
| 2008/0256287 A1 * | 10/2008 | Lee et al. | 711/103 |
| 2008/0320214 A1 * | 12/2008 | Ma et al. | 711/103 |

* cited by examiner

*Primary Examiner* — Aimee Li
*Assistant Examiner* — Craig Goldschmidt
(74) *Attorney, Agent, or Firm* — Dicke, Billig & Czaja, PLLC (57) ABSTRACT

Solid state storage devices and methods for flash translation layers are disclosed. In one such translation layer, a sector indication is translated to a memory location by a parallel unit look-up table is populated by memory device enumeration at initialization. Each table entry is comprised of communication channel, chip enable, logical unit, and plane for each operating memory device found. When the sector indication is received, a modulo function operates on entries of the look-up table in order to determine the memory location associated with the sector indication.

24 Claims, 7 Drawing Sheets

| PU | PLANE | LUN | CE | CHANNEL |
|---|---|---|---|---|
| 0 | 0 | 0 | 0 | 0 |
| 1 | 0 | 0 | 0 | 1 |
| 2 | 0 | 0 | 0 | 2 |
| 3 | 0 | 0 | 0 | 3 |
| 4 | 0 | 0 | 0 | 4 |
| 5 | 0 | 0 | 0 | 5 |
| 6 | 0 | 0 | 0 | 6 |
| 7 | 0 | 0 | 0 | 7 |
| 8 | 0 | 0 | 1 | 0 |
| 9 | 0 | 0 | 1 | 1 |
| 10 | 0 | 0 | 1 | 2 |
| 11 | 0 | 0 | 1 | 3 |
| 12 | 0 | 0 | 1 | 4 |
| 13 | 0 | 0 | 1 | 5 |
| 14 | 0 | 0 | 1 | 6 |
| 15 | 0 | 0 | 1 | 7 |
| 16 | 1 | 0 | 0 | 0 |
| 17 | 1 | 0 | 0 | 1 |
| 18 | 1 | 0 | 0 | 2 |
| 19 | 1 | 0 | 0 | 3 |
| 20 | 1 | 0 | 0 | 4 |
| 21 | 1 | 0 | 0 | 5 |
| 22 | 1 | 0 | 0 | 6 |
| 23 | 1 | 0 | 0 | 7 |
| 24 | 1 | 0 | 1 | 0 |
| 25 | 1 | 0 | 1 | 1 |
| 26 | 1 | 0 | 1 | 2 |
| 27 | 1 | 0 | 1 | 3 |
| 28 | 1 | 0 | 1 | 4 |
| 29 | 1 | 0 | 1 | 5 |
| 30 | 1 | 0 | 1 | 6 |
| 31 | 1 | 0 | 1 | 7 |

FIG. 5

| PU | PLANE | LUN | CE | CHANNEL |
|---|---|---|---|---|
| 0 | 0 | 0 | 0 | 0 |
| 1 | 0 | 0 | 0 | 1 |
| 2 | 0 | 0 | 0 | 2 |
| 3 | 0 | 0 | 0 | 3 |
| 4 | 0 | 0 | 0 | 4 |
| 5 | 0 | 0 | 0 | 5 |
| 6 | 0 | 0 | 0 | 6 |
| 7 | 0 | 0 | 0 | 7 |
| 8 | 0 | 0 | 1 | 0 |
| 9 | 0 | 0 | 1 | 1 |
| 10 | 0 | 0 | 1 | 2 |
| 11 | 0 | 0 | 1 | 4 |
| 12 | 0 | 0 | 1 | 5 |
| 13 | 0 | 0 | 1 | 6 |
| 14 | 0 | 0 | 1 | 7 |
| 15 | 1 | 0 | 0 | 0 |
| 16 | 1 | 0 | 0 | 1 |
| 17 | 1 | 0 | 0 | 2 |
| 18 | 1 | 0 | 0 | 3 |
| 19 | 1 | 0 | 0 | 4 |
| 20 | 1 | 0 | 0 | 5 |
| 21 | 1 | 0 | 0 | 6 |
| 22 | 1 | 0 | 0 | 7 |
| 23 | 1 | 0 | 1 | 0 |
| 24 | 1 | 0 | 1 | 1 |
| 25 | 1 | 0 | 1 | 2 |
| 26 | 1 | 0 | 1 | 4 |
| 27 | 1 | 0 | 1 | 5 |
| 28 | 1 | 0 | 1 | 6 |
| 29 | 1 | 0 | 1 | 7 |

TRANSLATION LAYER IN A SOLID STATE STORAGE DEVICE

RELATED APPLICATION

This application is a continuation of U.S. application Ser. No. 12/250,043, titled "TRANSLATION LAYER IN A SOLID STATE STORAGE DEVICE," filed Oct. 13, 2008 (allowed), which is commonly assigned and incorporated in its entirety herein by reference.

FIELD

The present invention relates generally to memory devices and in a particular embodiment the present invention relates to non-volatile memory devices.

BACKGROUND

Memory devices can include internal, semiconductor, integrated circuits in computers or other electronic devices. There are many different types of memory including random-access memory (RAM), read only memory (ROM), dynamic random access memory (DRAM), static RAM (SRAM), synchronous dynamic RAM (SDRAM), and non-volatile memory (e.g., flash memory).

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Flash memory devices can also be incorporated into solid state storage devices such as solid state drives. A solid state drive is comprised of multiple flash packages where each package can be comprised of many memory dies. Solid state drives are used in computers to replace the hard disk drives that typically have used magnetic or optical disks for storing large amounts of data. A solid state drive does not use moving parts whereas a hard disk drive requires a complex and sensitive drive and read/write head assembly to interact with the magnetic/optical disk. Thus, the solid state drives are more resistant to damage and loss of data through vibration and impacts.

One drawback to current solid state drive technology is that, due to the large number of memory dies in each drive, the chances of having a defective memory die during manufacture of the drive are greatly increased. Thus the drive would either have to be thrown out, a very expensive option, or the solid state drive controller would have to compensate for the defective die by mapping it out during access of the memory dies by the system.

A Flash Translation Layer (FTL) works in conjunction with an operating system to make flash memory appear to the operating system as a disk drive. This is accomplished by the FTL creating virtual small blocks of data, also known as sectors, out of flash erase blocks. The FTL also manages and maps data on the solid state drive so that it appears to the system to be written in a certain location when in fact it is being stored, for wear leveling purposes, in different locations of the flash memory.

The FTL performs these tasks by generating and maintaining large tables in memory to map host requests to one sector of a disk drive to the actual location of data in the flash memory dies of the solid state drive. These tables can be so large that the system RAM cannot hold them and the flash memory has to be used as overflow memory to hold portions of the tables. The large tables not only waste RAM that can be used for other tasks but system performance suffers when the FTL has to access flash memory to retrieve table data since the flash memory is slower than RAM at reading and writing.

For the reasons stated above, and for other reasons stated below that will become apparent to those skilled in the art upon reading and understanding the present specification, there is a need in the art for a more efficient Flash Translation Layer.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
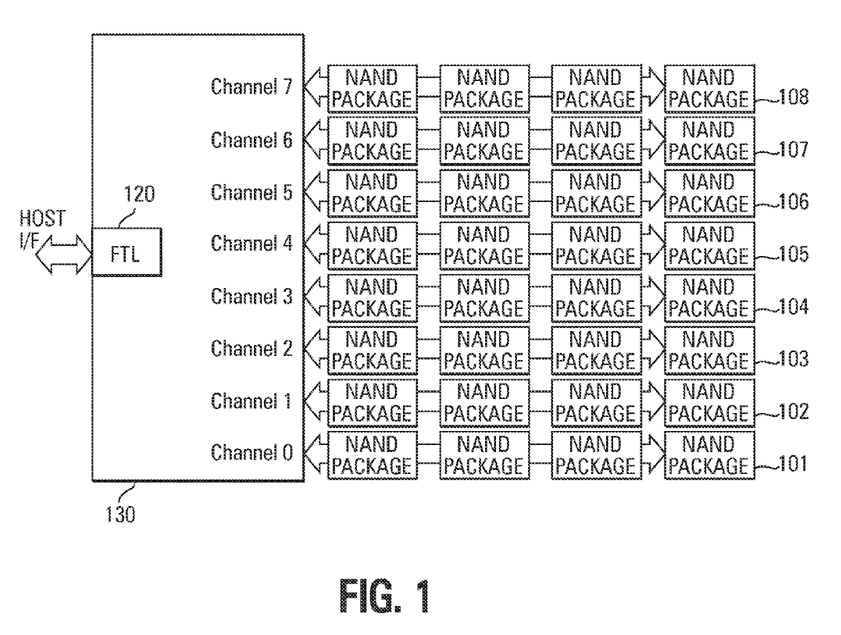
FIG. 1 shows a solid state drive that incorporates a Flash Translation Layer.

FIG. 1 illustrates a block diagram of one embodiment of a solid state drive that incorporates a Flash Translation Layer (FTL) 120. The drive of FIG. 1 is comprised of a controller 130, having eight communication channels 101-108, that executes the FTL 120. Each channel 101-108 is connected to four stacked memory packages. These devices are illustrated as NAND memory packages. Alternate embodiments can use other types of solid state memory.

A single die within a NAND package is referred to as a logical unit (LUN) and can be accessed in a parallel manner. An LUN may contain multiple planes and each plane is a parallel unit (PU). Each PU is assigned a unique number or some other unique identifier.

Each logical unit might share the same chip select (CE) signal so that each logical unit is accessed by an address bit to distinguish the multiple dies in the package. The multiple dies may operate in parallel on different commands at the same time. In other words, one die might be experiencing a write operation while another is experiencing a read operation. The FTL intends to refer to only planes as PUs. The FTL method also refers to the different planes of a parallel unit. Each plane can be comprised of a different memory die.

Figure 2:
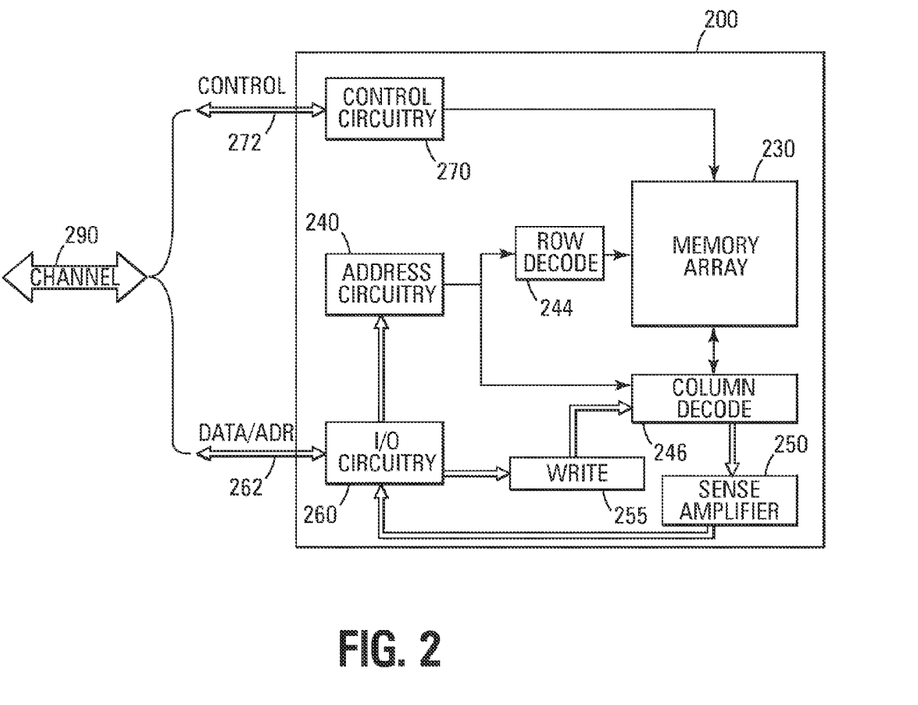
FIG. 2 shows a block diagram of one embodiment of a non-volatile memory device, in accordance with the solid state drive of FIG. 1, that incorporates a flash memory array and a memory communication channel.

FIG. 2 illustrates a functional block diagram of a non-volatile memory device 200 that can be incorporated on an integrated circuit die. The non-volatile memory device 200, in one embodiment, is flash memory.

Figure 3:
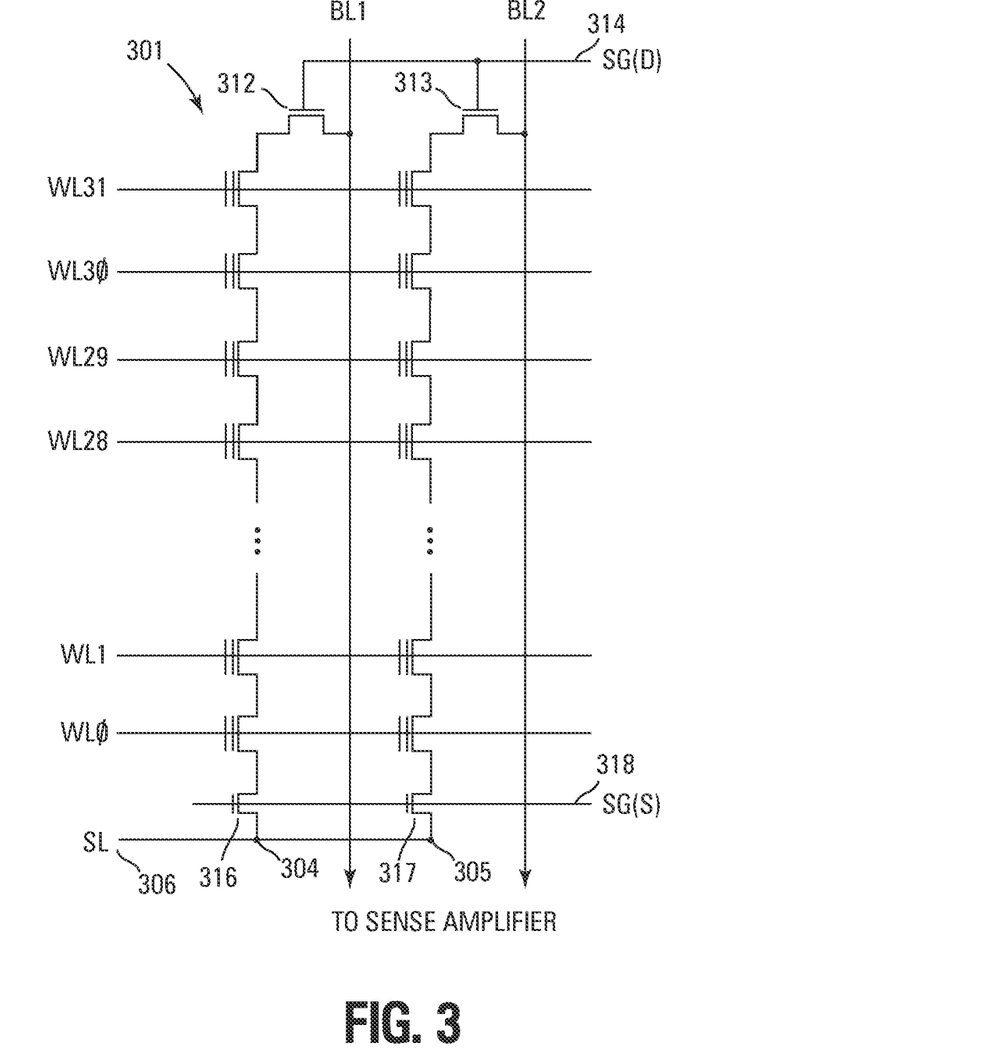
FIG. 3 shows a schematic diagram of one embodiment of a portion of a non-volatile memory array in accordance with the non-volatile memory devices of FIGS. 1 and 2.

The non-volatile memory device 200 includes an array 230 of non-volatile memory cells such as the floating gate memory cells that are illustrated in FIG. 3 and discussed subsequently. The memory array 230 is arranged in banks of access line (e.g., word line) rows and data line (e.g., bit line) columns. In one embodiment, the columns of the memory array 230 are comprised of series strings of memory cells. As is well known in the art, the connections of the cells to the bit lines determines whether the array is a NAND architecture, an AND architecture, or a NOR architecture.

The memory array 230 can be organized into memory blocks. The quantity of memory blocks is typically determined by the size of the memory device (i.e., 512 MB, 1 GB). In one embodiment, each memory block is organized into 64 pages.

Address buffer circuitry 240 is provided to latch address signals provided through the I/O circuitry 260. Address signals are received and decoded by a row decoder 244 and a column decoder 246 to access the memory array 230. It will be appreciated by those skilled in the art, with the benefit of the present description, that the number of address input connections depends on the density and architecture of the memory array 230. That is, the number of addresses increases with both increased memory cell counts and increased bank and block counts. Data is also input and output through the I/O circuitry 260 based on the timing of the control signals 272.

The non-volatile memory device 200 reads data in the memory array 230 by sensing voltage or current changes in the memory array columns using sense amplifier circuitry 250. The sense amplifier circuitry 250, in one embodiment, is coupled to read and latch a row of data from the memory array 230. Data input and output buffer circuitry 260 is included for bidirectional data communication as well as address communication over a plurality of data connections 262 with an external controller. Write circuitry 255 is provided to write data to the memory array.

The memory control circuitry 270 decodes signals provided on control bus 272 from an external controller. These signals can include read/write (R/$\overline{W}$), chip enable (CE), command latch enable (CLE), address latch enable (ALE) as well as other control signals that are used to control the operations on the memory array 230 as well as other circuitry of the memory device 200. In one embodiment, these signals are active low but alternate embodiments can use active high signals. The memory control circuitry 270 may be a state machine, a sequencer, or some other type of controller to generate the memory control signals.

The non-volatile memory device 200 communicates with an external controller over the communication channel 290, as illustrated in FIG. 1. In one embodiment, the channel 290 is comprised of the memory address, data, and control signals between the solid state drive controller and the memory device 200. The embodiment of FIG. 2 shows the address and data being coupled as one bus to the I/O circuitry 260. In an alternate embodiment, the address and data buses are separate inputs/outputs with the memory device 200.

FIG. 3 illustrates a schematic diagram of a portion of a NAND architecture memory array comprising series strings of non-volatile memory cells. While the subsequent discussions refer to a NAND memory device, the present embodiments are not limited to such an architecture.

The memory array is comprised of an array of non-volatile memory cells 301 (e.g., floating gate) arranged in columns such as series strings 304, 305. Each of the cells 301 are coupled drain to source in each series string 304, 305. A word line WL0-WL31 that spans across multiple series strings 304, 305 is connected to the control gates of each memory cell in a row in order to bias the control gates of the memory cells in the row. Bit lines BL1, BL2 are eventually connected to sense amplifiers (not shown) that detect the state of each cell by sensing current on a particular bit line.

Each series string 304, 305 of memory cells is coupled to a source line 306 by a source select gate 316, 317 and to an individual bit line BL1, BL2 by a drain select gate 312, 313. The source select gates 316, 317 are controlled by a source select gate control line SG(S) 318 coupled to their control gates. The drain select gates 312, 313 are controlled by a drain select gate control line SG(D) 314.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ windows that each indicate a different state. Multilevel cells can take advantage of the analog nature of a traditional flash cell by assigning a bit pattern to a specific voltage range stored on the cell. This technology permits the storage of two or more bits per cell, depending on the quantity of voltage ranges assigned to the cell.

Figure 4:
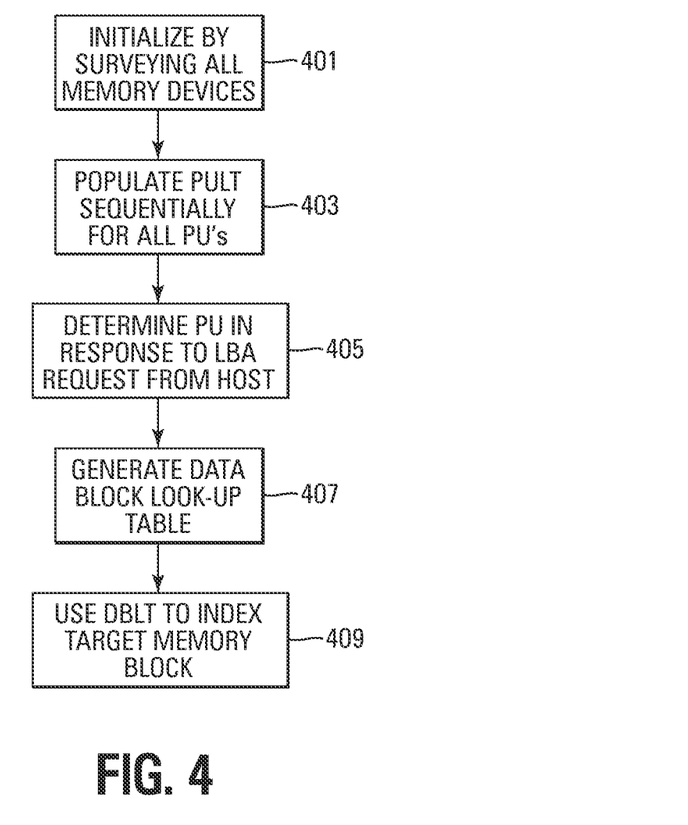
FIG. 4 shows a flowchart of one embodiment of a Flash Translation Layer method.

FIG. 4 illustrates a flowchart of one embodiment of an FTL method in a solid state memory device such as the solid state drive of FIG. 1. While the FTL method is described in terms of the solid state drive of FIG. 1, other memory devices that require a translation layer can also use such a method.

When the solid state drive is initially powered up, a survey is done of all of the memory devices in the solid state drive 401 to determine their existence and location characteristics (e.g., channel, chip enable, logical unit, plane). The devices are enumerated across all communication channels and chip enables. A Parallel Unit Look-up Table (PULT) is generated 403 sequentially by communication channel, CE, logical unit (LUN), and the plane of the parallel unit. This initialization sets up an inherently parallel access scheme utilizing bandwidth across communication channels as the highest priority and parallel unit planes as the lowest priority. In other embodiments, due to specific architecture requirements, the PUs may be ordered with planes, CEs or LUNs as highest priority.

In one embodiment, the PULT is stored in block 0 of a memory device. Block 0 is typically the memory block that has been tested as being free of errors. Alternate embodiments can store the PULT in RAM or some other memory location.

Figure 5:
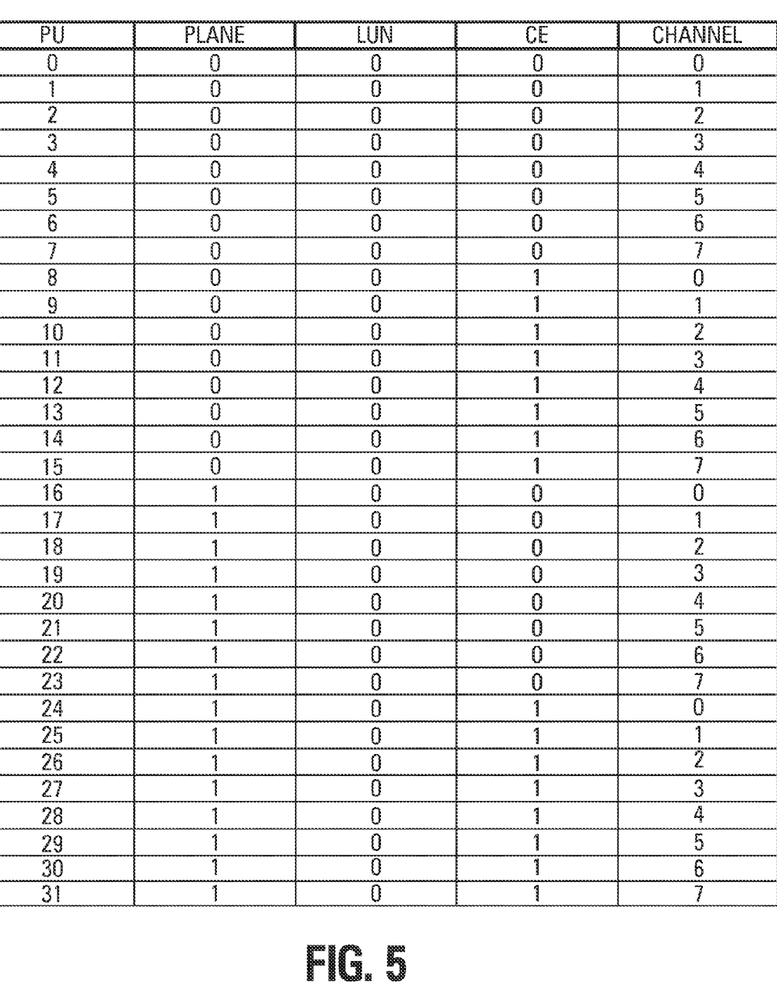
FIG. 5 shows one embodiment of parallel unit look up table in accordance with the Flash Translation Layer method of FIG. 4.

An example of such a table is illustrated in FIG. 5. This figure shows that after the initial survey of the devices, eight channels, two chip enables, one LUN, and two planes were enumerated in the table.

Figure 6:
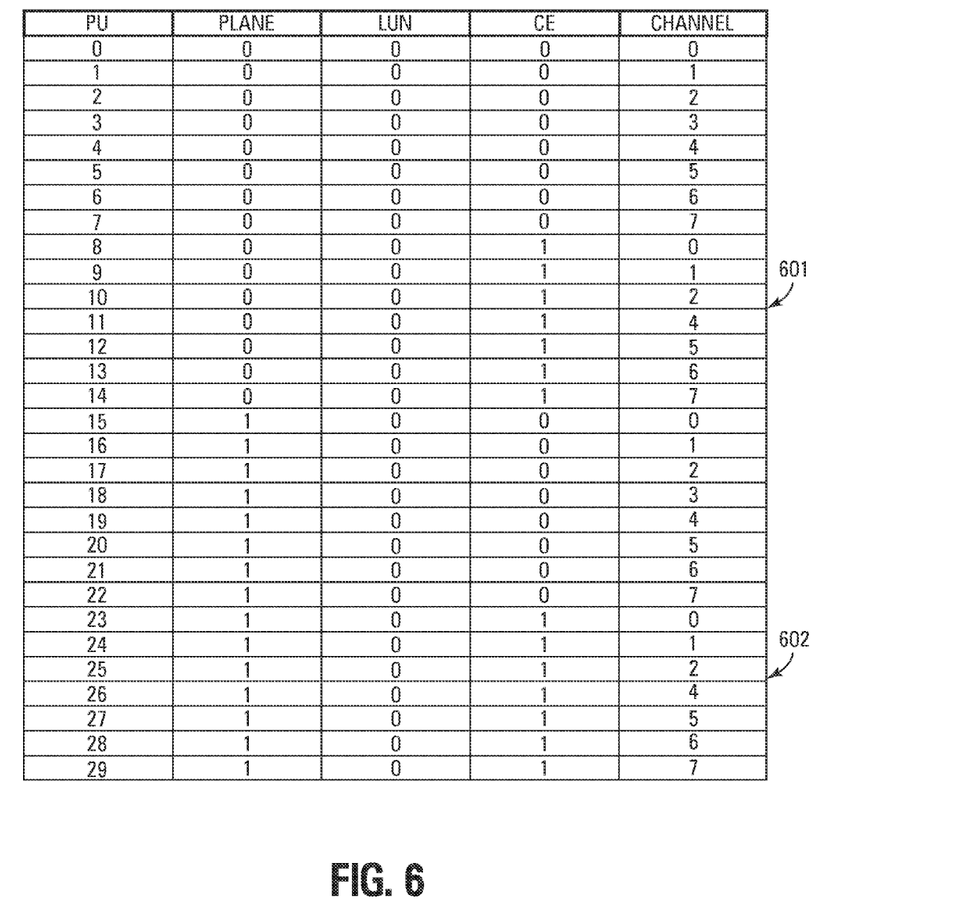
FIG. 6 shows another embodiment of a parallel unit look up table in accordance with the Flash Translation Layer method of FIG. 4.

FIG. 6 illustrates an alternate embodiment of a table generated by the FTL in which a NAND device is not found during the initialization routine. This figure shows that communication channel 3/CE1 is missing, resulting in the loss of two planes 601, 602. The PULT is still populated in the same manner as the embodiment of FIG. 5 except only 30 PU's are found.

After the PULT is populated, the FTL is ready to receive sector requests from the host system. Since a solid state drive emulates a hard drive that is comprised of sectors, the FTL of the present embodiments is capable of receiving a sector indication (e.g., sector number) from the host computer system and accessing the appropriate location in memory. The sector number from the host can be either in the form of a read command or a write command. The FTL, or some other solid state drive algorithm, is responsible for erasing and wear leveling such that these operations are transparent to the host.

The sector request from the host is comprised of a sector number along with the command (e.g., read, write). The FTL uses the sector number as a logical block address (LBA) in accessing the solid state drive. In one embodiment, each NAND page linearly stores eight LBAs of data. Since the FTL deals in terms of LBAs instead of hard drive sectors, subsequent discussions will reference LBA requests from the host instead of sector requests.

Referring again to the flowchart of FIG. 4, when an LBA request is received from the host, the FTL first determines the PU location 405 of the LBA in the solid state device. In the illustrated embodiment, this is accomplished using a modulo arithmetic function.

The modulo function is expressed as $(Q,R)=MOD(LBA>>(j=3), N)$ where Q is a quotient used in subsequent calculations, R is the remainder from the modulo operation, and N is the quantity of PUs found during the initialization of the PULT. For example, the embodiment of FIG. 5 found 32 PUs while the embodiment of FIG. 6 found 30 PUs.

The modulo function shows that an LBA received from the host is right shifted three positions to account for the eight LBAs per page. As is well known in the art, right shifting a number three times is equivalent to dividing by eight. The number of right shifts is changed in response to larger sector sizes (i.e., larger NAND pages) in a solid state device. This can be expressed as $j=2^j$ LBAs per page, right shift by j.

N, the number of PUs, is subsequently expressed as a binary number. However, N is not limited to only binary numbers.

Two examples of operation of the above modulo function in finding the PU from a received LBA are described subsequently. These examples are based on a PULT that is missing two PUs, as illustrated in the embodiment of FIG. 6. In other words, the following examples assume that N=30.

In the first example, the received LBA=3 that is represented in binary as:

00000000 00000000 00000000 00000011

When the LBA is right shifted three times, the right three bits are dropped and the result is 0. The modulo function is expressed as (0,0)=MOD(0, 30). Using the remainder, R=0, as the PU index, this number is used in the PULT to determine the location of the LBA in terms of the communication channel, the chip enable (CE), the logical unit (LUN), and the PU plane number. Referring to FIG. 6, it can be seen that PULT[0]=Channel 0, CE 0, LUN 0, and Plane 0 is the location of an LBA of 3.

In a second example, the received LBA=30,500,129. This LBA is represented in binary as:

00000001 11010001 01100101 00100001

When the LBA is right shifted three times, the right-most "001" drops off resulting in a binary expression of:

00000000 00111010 00101100 10100100

In other words, LBA>>3=3,812,516. The modulo function is then expressed as (127083, 26)=MOD(3812516, 30). Since the remainder is 26, this is used as an index for the PULT. Thus, referring again to FIG. 6, it can be seen that PULT[26]=Channel 4, CE 1, LUN 0, and Plane 1 is the location of LBA=30,500,129. LBA increments of eight or more are algorithmically pushed to the next PU.

Once the PU is found, a data block look-up table (DBLT) is generated 407. The DBLT is a direct access table that indicates what group of LBA are stored in which memory block on a particular PU. Each entry in the DBLT indicates a block number for the received LBA. The number of entries in the DBLT is equal to the number of PUs found during building of the PULT times the blocks per PU. For example, if a solid state drive is comprised of 256 PUs (8 channels, 8 CE, 2 LUNs, and 2 Planes) and there are 2048/blocks per plane, the DBLT is comprised of 524,288 entries.

In one embodiment, each entry in the DBLT is comprised of four bytes so that the table is 2,097,152 bytes. Two bytes of each entry is the block number in the particular PU. Another byte is an indication of the highest programmed page of that block to allow fast access to embedded page tables. The last byte is a status byte that can be used to indicate the condition of the indicated block. For example, the status byte can indicate the erased condition of the block, whether the block is in order, needs folding, or is folded. The present embodiments are not limited to such a format of the DBLT entry.

The DBLT is generated using (Q, R) from the PULT calculation as discussed previously. If k is defined as $2^k$=pages/memory block, DBLT[index]=(R*blocks per PU)+(Q>>k). The k variable is determined in response to the memory density of the memory block. For a 512 byte LBA in an MLC memory device, k=7 for 128 pages/block. For a 512 byte LBA in an SLC memory device, k=6 for 64 pages/block. The resulting DBLT[index] points to the target memory block containing the LBA 409.

Examples of operation of the DBLT[index] method, the same variables from the PULT examples discussed previously are used. In the example where LBA=3, the result was that Q=0, R=0, PULT[0]=Channel 0, CE 0, LUN 0, and Plane 0. Plugging these results into the DBLT method results in DBLT[index]=(Q>>k+R*2048)=0. If the status byte of the DBLT shows that the block has been ordered, the LBA on the target memory block is page(Q=0 && k bits)=0, position (LBA && J)=3 in that page. If the status byte shows that the memory block is not ordered, the embedded page table for the position in the memory block is used.

In the example where LBA=30,500,138, the result was that Q=127,083, R=26, PULT[26]=Channel 4, CE 1, LUN 0, and Plane 1. Plugging these results into the DBLT method results in DBLT[index]=(127,083>>6+26*2048)=55,233. If the status byte of the DBLT shows that the memory block has been ordered, the LBA on the target memory block is page (11111000001 101011 && 00111111)=43 and position (11111000001 00100001 && 0000011)=1 in that page.

Figure 7:
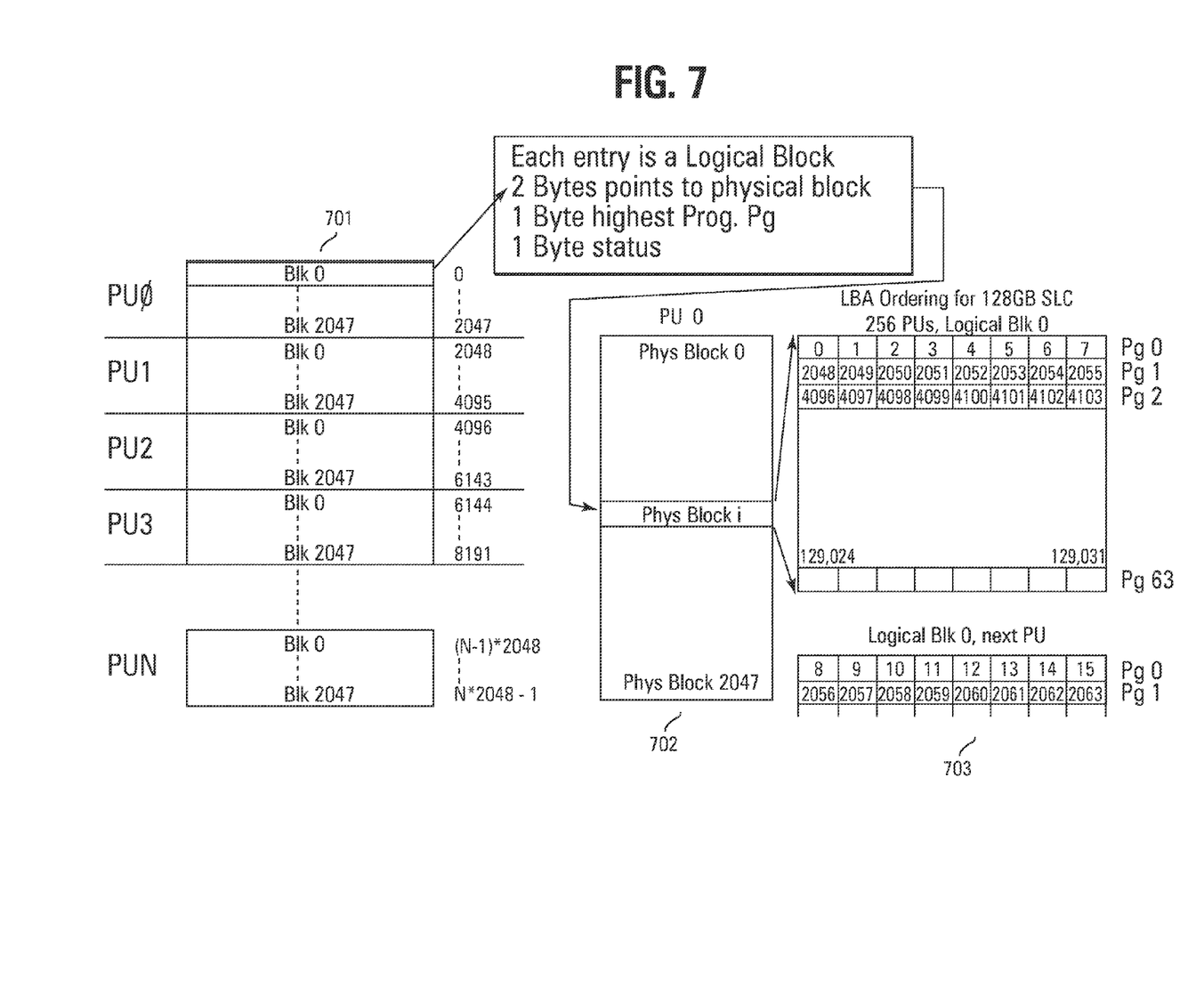
FIG. 7 shows a diagram of the data block look-up table concept in accordance with the method of FIG. 4.

FIG. 7 illustrates a diagram that highlights the result of the DBLT method discussed previously. The left side of the diagram shows the memory blocks assigned to each PU number 701. This diagram shows, for example, that PU0 has BLK0-BLK2047 and is in the logical memory range of 0 to 2047.

The center of the diagram 702 shows an expansion of the PU0 with physical blocks 0-2047 where physical block i is shown expanded further 703. The expansion of physical block i shows each of the 64 pages within the block (assuming an SLC memory device) and that each entry is a logical block. Two bytes of each entry points to a physical block, one byte is the highest programmed page of that block, and the remaining byte is the status byte.

CONCLUSION

In summary, one or more embodiments of the translation layer method provide a solid state storage device with the capability of translating a hard disk sector number received from a host computer system to a memory page and a position within that page. This can greatly reduce the large, memory intensive translation tables typically used in the prior art for translation. The translation layer supports flexible disk drive sector sizes, page sizes, pages per block, blocks per plane, planes per logical unit as well as a non-binary number of channels and chip enables.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating solid state device, the method comprising:
    enumerating memory devices of the solid state device and a location of each enumerated memory device;
    determining a target memory device of the enumerated memory devices in response to a sector identifier and the enumerated memory device locations; and
    generating a data block look-up table comprising a group of logical block addresses in the target memory device, each logical block address associated with a different data block look-up table entry, each data block look-up table entry comprising a first portion configured to indicate a highest programmed page of a memory block indicated by the associated logical block address and a second portion that is different from the first portion and that is configured to indicate that the memory block is ordered when the memory block is ordered and to indicate that the memory block is not ordered when the memory block is not ordered.

2. The method of claim 1, wherein the sector identifier is a sector number that is part of a sector request that also comprises a command.

3. The method of claim 1, wherein the command is a read or a write command.

4. The method of claim 1, wherein enumerating the memory devices and the memory device location comprises determining a communication channel, chip enable, logical unit, and plane for each of the enumerated memory devices.

5. The method of claim 1, wherein enumerating memory devices of the solid state device and a location of each enumerated memory device comprises generating a table that enumerates the memory devices and the memory device locations before generating the data block look-up table.

6. The method of claim 1, further comprising, before generating a data block look-up table:
    receiving the sector identifier;
    surveying the solid state device for memory devices and location characteristics of each memory device; and
    populating a memory device table that enumerates the memory devices and location characteristics of each enumerated memory device.

7. The method of claim 6, wherein surveying the solid state device comprises determining a communication channel, a chip enable, a logical unit, and a plane for each enumerated memory device.

8. The method of claim 7, wherein populating the memory device table comprises assigning a unique identifier to each enumerated memory device.

9. The method of claim 6, wherein each memory device table entry is comprised of communication channel information, chip enable information, logical unit information, memory device plane information, and memory device status information.

10. The method of claim 1, wherein the data block look-up table comprises indications of which sector identifiers are stored in the target memory device.

11. A method of operating a solid state device, the method comprising:
    determining the existence of memory devices within the solid state device and determining information about a memory location for each memory device determined to exist within the solid state device;
    generating a memory device table that enumerates the memory devices determined to exist within the solid state device and the information about the memory location for each memory device determined to exist within the solid state device, the memory device table comprising memory device identifiers assigned to each memory device enumerated in the memory device table;
    locating a target memory device in the memory device table, on the basis of the memory device identifiers of the memory device table, corresponding to a sector identifier and the memory location of the target memory device;
    generating a data block look-up table comprising a group of logical block addresses in the target memory device, each logical block address associated with a different data block look-up table entry, each entry comprising a first portion configured to indicate a highest programmed page of a memory block indicated by the associated logical block address and a second portion that is different from the first portion and that is configured to indicate that the memory block is ordered when the memory block is ordered and to indicate that the memory block is not ordered when the memory block is not ordered; and
    locating a target data block in the data block look-up table containing a logical block address corresponding to the sector identifier.

12. The method of claim 11, further comprising receiving the sector identifier from a host.

13. The method of claim 11, wherein the information about the memory location for each memory device determined to exist within the solid state device comprises communication channel information, chip enable information, logical unit information, and plane information.

14. The method of claim 13, wherein a plurality of different memory devices determined to exist within the solid state device have the same chip enable information.

15. The method of claim 13, wherein a plurality of different memory devices determined to exist within the solid state device have the same channel information.

16. The method of claim 13, wherein generating the memory device table that enumerates the memory devices determined to exist within the solid state device and the information about the memory location for each memory device determined to exist within the solid state device comprises populating the memory device table with the memory device identifiers and the information about the memory location for each memory device determined to exist within the solid state device.

17. The method of claim 11, wherein the logical block address corresponding to the sector identifier is shifted a plurality of times, in response to a quantity of logical block addresses per page.

18. The method of claim 11, wherein the data block look-up table is generated using a modulo function.

19. A solid state device comprising:
a controller;
wherein the controller is configured to enumerate memory devices of the solid state device and a location of each enumerated memory device;
wherein the controller is configured to determine a target memory device of the enumerated memory devices in response to a sector identifier and the enumerated memory device locations; and
wherein the controller is configured to generate a data block look-up table comprising a group of logical block addresses in the target memory device, each logical block address associated with a different data block look-up table entry, each data block look-up table entry comprising a first portion configured to indicate a highest programmed page of a memory block indicated by the associated logical block address and a second portion that is different from the first portion and that is configured to indicate that the memory block is ordered when the memory block is ordered and to indicate that the memory block is not ordered when the memory block is not ordered.

20. The solid state device of claim 19, wherein the controller being configured to enumerate memory devices of the solid state device and a location of each enumerated memory device comprises the controller being configured to generate a table that enumerates the memory devices and the memory device locations before generating the data block look-up table.

21. The solid state device of claim 19, wherein the controller is configured to execute a modulo function to generate the data block look-up table.

22. The solid state device of claim 19, wherein the controller is configured to generate a location of the target memory array by shifting a logical block address, corresponding to the sector identifier, a plurality of times, in response to a quantity of logical block addresses per page.

23. A solid state device comprising:
a controller;
wherein the controller is configured to determine the existence of memory devices within the solid state device and to determine information about a memory location for each memory device determined to exist within the solid state device;
wherein the controller is configured to generate a memory device table that enumerates the memory devices determined to exist within the solid state device and the information about the memory location for each memory device determined to exist within the solid state device, the memory device table comprising memory device identifiers assigned to each memory device enumerated in the memory device table;
wherein the controller is configured to locate a target memory device in the memory device table, on the basis of the memory device identifiers of the memory device table, corresponding to a sector identifier and the memory location of the target memory device;
wherein the controller is configured to generate a data block look-up table comprising a group of logical block addresses in the target memory device, each logical block address associated with a different data block look-up table entry, each entry comprising a first portion configured to indicate a highest programmed page of a memory block indicated by the associated logical block address and a second portion that is different from the first portion and that is configured to indicate that the memory block is ordered when the memory block is ordered and to indicate that the memory block is not ordered when the memory block is not ordered; and
wherein the controller is configured to locate a target data block in the data block look-up table containing a logical block address corresponding to the sector identifier.

24. The solid state device of claim 23, wherein the controller being configured to generate the memory device table that enumerates the memory devices determined to exist within the solid state device and the information about the memory location for each memory device determined to exist within the solid state device comprises the controller being configured to populate the memory device table with the memory device identifiers and the information about the memory location for each memory device determined to exist within the solid state device.

* * * * *